United States Patent

Okamoto

[11] Patent Number: 5,179,354
[45] Date of Patent: Jan. 12, 1993

[54] OPERATIONAL AMPLIFIER

[75] Inventor: Toshiyuki Okamoto, Tokyo, Japan

[73] Assignee: NEC Corporation, Tokyo, Japan

[21] Appl. No.: 822,750

[22] Filed: Jan. 21, 1992

[30] Foreign Application Priority Data

Jan. 18, 1991 [JP] Japan ................................. 3-4191

[51] Int. Cl.[5] .......................... H03F 3/45; H03F 3/16
[52] U.S. Cl. ..................................... 330/253; 330/259
[58] Field of Search .............. 330/253, 258, 277, 296, 330/311, 259, 261

[56] References Cited

U.S. PATENT DOCUMENTS

| | | | |
|---|---|---|---|
| 4,554,515 | 11/1985 | Burson et al. | 330/261 |
| 4,749,955 | 6/1988 | Cook | 330/263 |
| 4,794,349 | 12/1988 | Senderowicz | 330/253 |
| 4,963,834 | 10/1990 | Yukawa | 330/253 |

FOREIGN PATENT DOCUMENTS 0325299 7/1989 European Pat. Off. .
3725323 2/1988 Fed. Rep. of Germany .

Primary Examiner—Steven Mottola
Attorney, Agent, or Firm—Sughrue, Mion, Zinn, Macpeak & Seas

[57] ABSTRACT

A fully differential operational amplifier has a high DC gain and a high common mode feedback gain and produces an output voltage with rise and fall times shortened to the same extent. The operational amplifier comprises a first stage composed of MOS transistors M21 through M9, a drive stage composed of MOS transistors M10 through M17, and a phase-compensating circuit composed of MOS transistors M18, M19 and capacitive elements C1, C2. The drive stage is of a push-pull configuration of the MOS transistors M10 through M15 and the MOS transistors M16, M17. The above circuit arrangement increases the DC gain and the common mode feedback gain and shortens the rise and fall times of the output voltage to the same extent.

3 Claims, 2 Drawing Sheets 5,179,354

OPERATIONAL AMPLIFIER

BACKGROUND OF THE INVENTION

1. Field of the Invention

The present invention relates to an operational amplifier, and more particularly to a fully differential operational amplifier having a high common mode feedback gain.

2. Description of the Prior Art

Fully differential operational amplifiers are known which comprise initial and drive stages. As shown in FIG. 1 of the accompanying drawings, the initial stage of such a fully differential operational amplifier comprises a constant-current regulated power supply Il, P channel MOS transistors M41, M42 having respective sources connected to the constant-current regulated power supply Il and serving as an input transistor pair, and N channel MOS transistors M43, M44 connected to the respective drains of the P channel MOS transistors M41, M42 and serving as a load. The drive stage of the fully differential operational amplifier comprises P channel MOS transistors M47, M48, and N channel MOS transistors M45, M46 having respective drains connected to the P channel MOS transistors M47, M48. A common mode feedback loop for keeping noninverted and inverted common mode voltages at a constant level is composed of a circuit for generating the average of noninverted and inverted output voltages and a feedback loop for connecting the output from the circuit to the gates of the P channel MOS transistors M47, m48. When the voltage at a noninverting input terminal IN+ is higher than the voltage at an inverting input terminal IN−, the current flowing through the N channel MOS transistor M44 is less than the current flowing through the N channel MOS transistor M43. Therefore, the gate voltage of the N channel MOS transistor M46 is lower than the gate voltage of the N channel MOS transistor M45, and the noninverted output voltage is higher than the inverted output voltage.

The noninverted and inverted common mode voltages are fixed at intermediate points of first and second power supply terminals 41, 42 for supplying a power supply voltage Vcc therebetween. These fixed voltages are realized by the common mode feedback loop as follows: the circuit arrangement is designed such that the noninverted and inverted common mode voltages are the same as the potentials at the intermediate point of the first and second power supply terminals when a fixed potential Vc of the constant-current regulated power supply Il is equalized to the power supply voltage Vcc. In FIG. 4, the potential at a terminal Vb' becomes (Vout+ +Vout−) −5+Vb when the power supply voltages are 0V and 5V. The potential at a terminal Vb may be selected such that a negative feedback loop operates to equalize (Vout+ +Vout−)−5 to 0 by connecting the terminal Vb' shown in FIG. 4 to the terminal Vb, shown in FIG. 1, making it possible to equalize the average (common mode voltage) of the noninverted and inverted output voltages to 2.5 V.

The operational amplifier shown in FIG. 1 is, however, disadvantageous in that the feedback gain of the common mode feedback circuit for keeping noninverted and inverted common mode voltages at a constant level is determined only by the gain of the inverter circuit composed of the P channel MOS transistors M47, M48 and the N channel MOS transistors M45, M46, and is at most about 20 dB.

Another disadvantage is that the fall time of the output signal is limited and delayed by the mutual conductance gm of the P channel MOS transistors in the case where a capacitive element is used as the load.

A further disadvantage is that the DC gain of the initial stage is governed by the product of the mutual conductance gm of the P channel MOS transistors M41, M42 and the initial stage output resistance determined by the N channel MOS transistors M43, M44, and is reduced in inverse proportion to the square root by increasing the initial stage current in order to increase the GB product.

SUMMARY OF THE INVENTION

It is an object of the present invention to provide an operational amplifier which has a high DC gain and a high common mode feedback gain, and which can shorten rise and fall times of an output voltage to the same extent.

To achieve the above object, the present invention provides for an operational amplifier comprising: at least initial and drive stages, the initial stage comprising a first power supply terminal; a first constant-current regulated power supply having one terminal connected to the first power supply terminal; a first field-effect transistor of a first conductivity type having a source connected to the first power supply terminal; second and third field-effect transistors of the first conductivity type having respective sources connected to a drain of the first field-effect transistor of the first conductivity type; fourth and fifth field-effect transistors of the first conductivity type having respective sources connected to an opposite terminal of the first constant-current regulated power supply; a second power supply terminal; a first field-effect transistor of a second conductivity type having a drain and a gate connected to a drain of the second field-effect transistor of the first conductivity type and a source connected to the second power supply terminal; a second field-effect transistor of the second conductivity type having a drain and a gate connected to a drain of the third field-effect transistor of the first conductivity type and a source connected to the second power supply terminal; a third field-effect transistor of the second conductivity type having a drain connected to a drain of the fourth field-effect transistor of the first conductivity type, a gate connected in common to a drain and a gate of the first field-effect transistor of the second conductivity type, and a source connected to the second power supply terminal; a fourth field-effect transistor of the second conductivity type having a drain connected to a drain of the fifth field-effect transistor of the first conductivity type, a gate connected in common to a drain and a gate of the second field-effect transistor of the second conductivity type, and a source connected to the second power supply terminal; a noninverting input terminal connected to gates of the second and fifth field-effect transistors of the first conductivity type; and an inverting input terminal connected to gates of the third and fourth field-effect transistors of the first conductivity type; the drive stage comprising a fifth field-effect transistor of the second conductivity type having a gate connected to the gate of the third field-effect transistor of the second conductivity type and a source connected to the second power supply terminal; a sixth field-effect transistor of the second conductivity type having a gate connected to the gate of the fourth field-effect transistor of the second conductivity type and a source connected to the second power supply terminal; a sixth field-effect transistor of the first conductivity type having a drain and a gate commonly connected to a drain of the fifth field-effect transistor of the second conductivity type and a source connected to the first power supply terminal; a seventh field-effect transistor of the first conductivity type having a drain and a gate commonly connected to a drain of the sixth field-effect transistor of the second conductivity type and a source connected to the first power supply terminal; a seventh field-effect transistor of the second conductivity type having a gate connected in common to the drain of the fourth field-effect transistor of the first conductivity type and a drain of the third field-effect transistor of the second conductivity type and a source connected to the second power supply terminal; an eighth field-effect transistor of the first conductivity type having a gate connected in common to the drain of the fifth field-effect transistor of the first conductivity type and a drain of the fourth field-effect transistor of the second conductivity type and a source connected to the second power supply terminal; an eighth field-effect transistor of the second conductivity type having a drain connected to a drain of the seventh field-effect transistor of the second conductivity type, a gate connected in common to the drain and the gate of the sixth field-effect transistor of the first conductivity type, and a source connected to the first power supply terminal; a ninth field-effect transistor of the second conductivity type having a drain connected to the drain of the eighth field-effect transistor of the second conductivity type, a gate connected in common to the drain and the gate of the seventh field-effect transistor of the first conductivity type, and a source connected to the first power supply terminal; an inverted output terminal connected in common to the drain of the seventh field-effect transistor of the second conductivity type and the drain of the eighth field-effect transistor of the second conductivity type; and a noninverted output terminal connected in common to the drain of the ninth field-effect transistor of the second conductivity type and the drain of the eighth field-effect transistor of the second conductivity type; a circuit for producing the average of a voltage at the noninverted output terminal and a voltage at the inverted output terminal; and a feedback loop interconnecting an output terminal of the circuit and a gate of the first field-effect transistor of the first conductivity type.

The present invention includes an operational amplifier which is the same as one described above in which the field-effect transistors of the first conductivity type are P channel MOS's and field-effect transistors of the second conductivity type are N channel MOS's, or in which the field-effect transistors of the first conductivity type are N channel MOS's and field-effect transistors of the second conductivity type are P channel MOS's.

The above and other objects, features, and advantages of the present invention will become apparent from the following description when taken in conjunction with the accompanying drawings which illustrate preferred embodiments of the present invention of example.

DETAILED DESCRIPTION OF THE PREFERRED EMBODIMENTS

Figure 2:
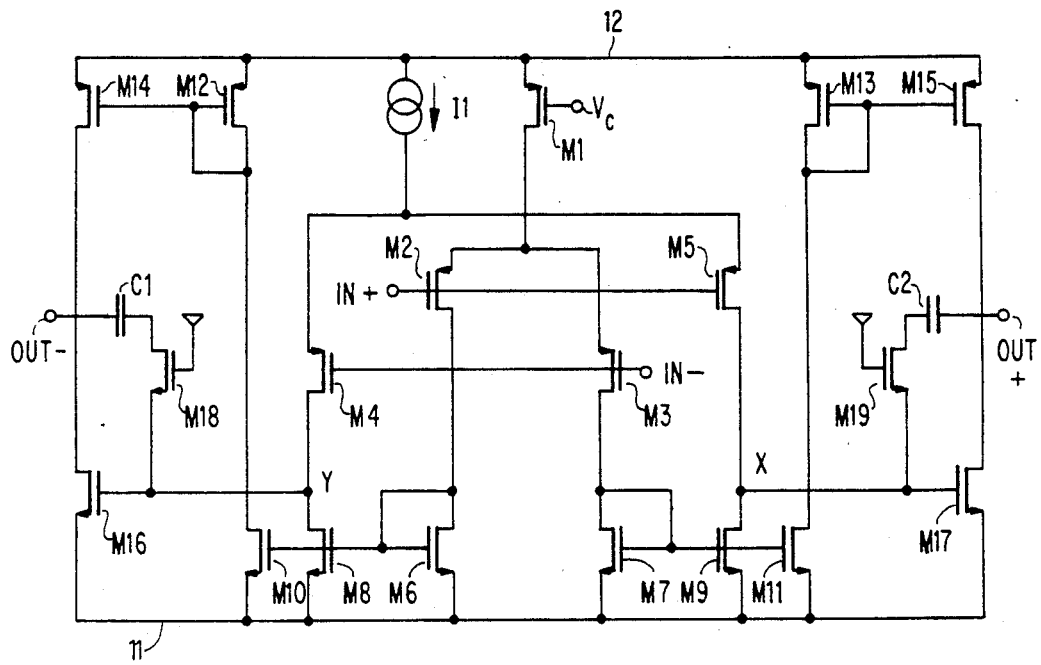
FIG. 2 is a circuit diagram of an operational amplifier according to a first embodiment of the present invention.

FIG. 2 shows an operational amplifier according to a first embodiment of the present invention.

As shown in FIG. 2, the operational amplifier has a constant-current regulated power supply I1, input-stage paired transistors M2, M3, M4, M5, and load transistors M6, M7, M8, M9. The transistors M2, M5, which are P channel MOS transistors, have gates connected to a noninverting input terminal IN+, and the transistors M3, M4, which are P channel MOS transistors, have gates connected to an inverting input terminal IN−. The operational amplifier includes a drive stage comprising N channel MOS transistors M10, M11, M16, M17 and P channel MOS transistors M12, M13, M214, M15. The operational amplifier also has a P channel MOS transistor M1 that operates as a constant-current regulated power supply. N channel MOS transistors M18, M19 and capacitive elements C1, C2 jointly constitute a phase-compensating circuit.

Figure 1:
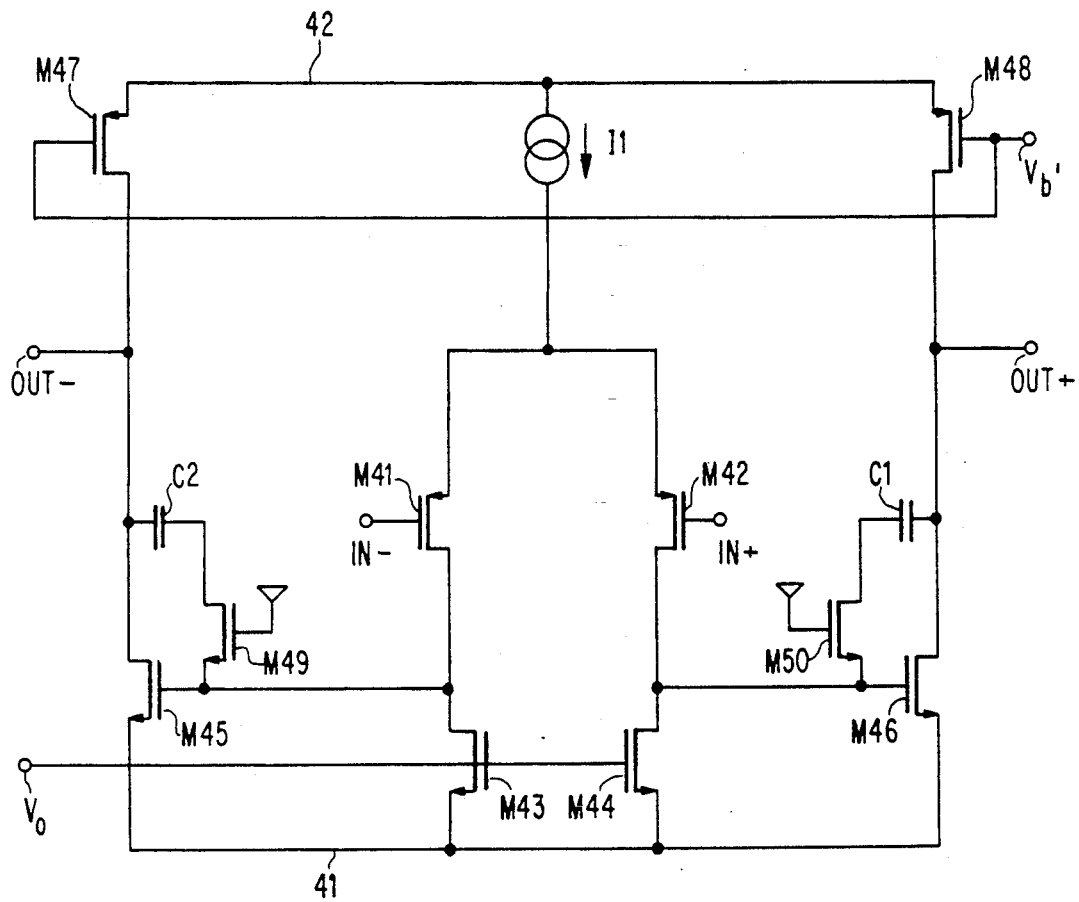
FIG. 1 is a circuit diagram of a conventional operational amplifier.
Figure 4:
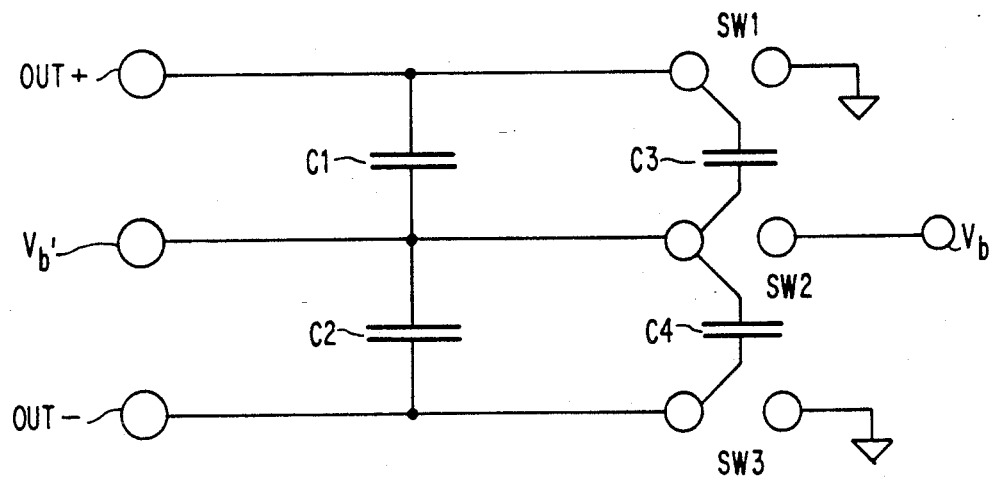
FIG. 4 is a circuit diagram of a circuit for producing the average of noninverted and inverted output voltages.

FIG. 4 shows a circuit for producing the average of noninverted and inverted output voltages. The circuit shown in FIG. 4 comprises capacitive elements C1, C2, C3, C4 and switches S1, SW2, SW3.

Operation of the operational amplifier will be described below with reference to FIGS. 2 and 4.

When the potential at the noninverting input terminal IN+ is higher than the potential at the inverting input terminal IN−, currents flowing through the P channel MOS transistors M2, M5 are smaller than currents flowing through the P channel MOS transistors M3, M4, respectively. Therefore, the potential at the common gate of the N channel MOS transistors M7, M9 is increased, and the potential at the common gate of the N channel MOS transistors M6, M8 is lowered. The current flowing through the N channel MOS transistor M9 (which is the same as the current flowing through the P channel MOS transistor M5) is decreased, and the current flowing through the N channel MOS transistor M8 (which is the same as the current flowing through the P channel MOS transistor M4) is increased. Therefore, the potential at an output voltage point X of the initial stage is decreased, and the potential at a noninverted output terminal OUT+ is increased. At this time, the current flowing through the N channel MOS transistor M11 decreases, and the current flowing through the N channel MOS transistor M17 is reduced by a current mirror circuit composed of the P channel MOS transistors M13, M15, resulting in a further increase in the voltage at the noninverted output terminal OUT+. The potential at an initial-stage output point Y is increased, causing the potential at an inverted output terminal OUT− to be decreased.

Conversely, when the potential at the noninverting input terminal IN+ is lower than the potential at the inverting input terminal IN−, the currents flowing through the P channel MOS transistors M2, M5 are greater than the currents flowing through the P channel MOS transistors M3, M4, respectively. Therefore, the potential at the common gate of the N channel MOS transistors M7, M9 is reduced, and the potential at the common gate of the N channel MOS transistors M6, M8 is increased. The current flowing through the N channel MOS transistor M9 (which is the same as the current flowing through the P channel MOS transistor M5) is increased, and the current flowing through the N channel MOS transistor M8 (which is the same as the current flowing through the P channel MOS transistor M4) is decreased. Therefore, the potential at the output voltage point X of the initial stage is increased, and the potential at the noninverted output terminal OUT+ is decreased. At this time, the current flowing through the N channel MOS transistor M11 is decreased, and the current flowing through the N channel MOS transistor M17 is also reduced by the current mirror circuit composed of the P channel MOS transistors M13, M15, resulting in a further reduction in the voltage at the noninverted output terminal OUT+. The potential at the initial-stage output voltage point Y is decreased, and the potential at the inverted output terminal OUT− is increased.

The common mode voltages at the noninverted and inverted output terminals are fixed at the intermediate points of first and second power supply terminals 11, 12 for supplying a power supply voltage Vcc therebetween. These fixed voltages are achieved by a common mode feed-back loop as follows: The circuit arrangement is designed such that the noninverted and inverted common mode voltages are the same as the potentials at the intermediate points of the first and second power supply terminals when a potential at a terminal Vc shown in FIG. 2 is equalized to the potential at a terminal Vb shown in FIG. 4. The potential at a terminal Vb' becomes (Vout+ +Vout−)−5+Vb through the circuit shown in FIG. 4 when the power supply voltages are 0 V and 5 V respectively, and a negative feedback loop operates to equalize (Vout+ +Vout−)−5 to 0 by connecting the terminal Vb' shown in FIG. 4 to the terminal Vc shown in FIG. 2, making it possible to equalize the average (common mode voltage) of the noninverted and inverted output voltages to 2.5 V. It is possible to increase the gain of the common mode feed-back loop as high as the differential gain, normally as high as about 80 dB.

Figure 3:
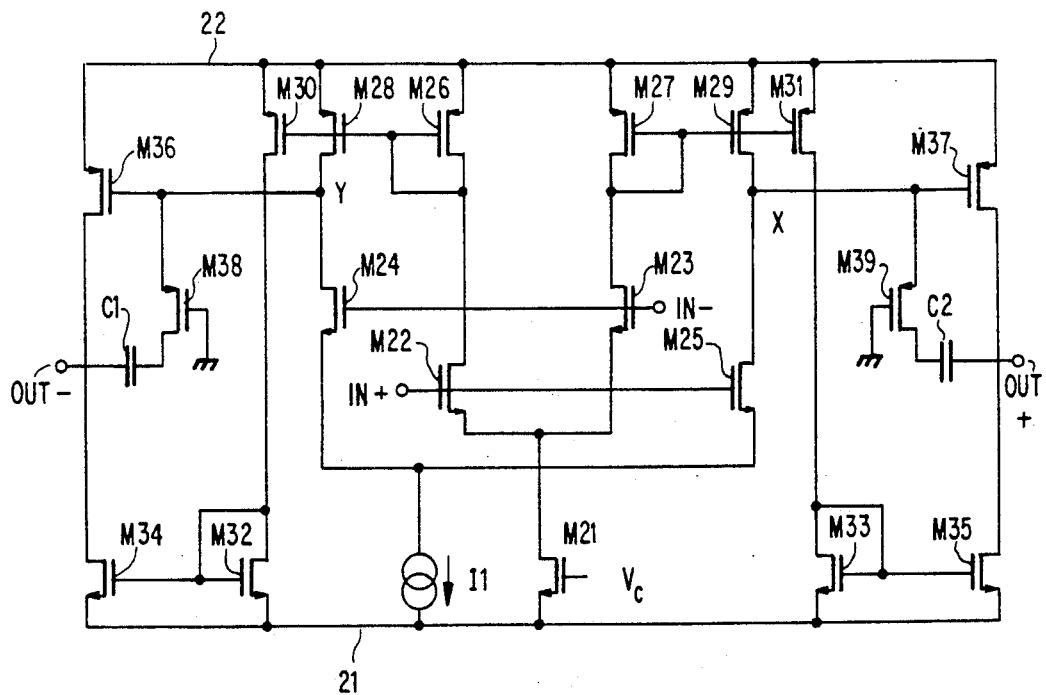
FIG. 3 is a circuit diagram of an operational amplifier according to a second embodiment of the present invention.

FIG. 3 shows an operational amplifier according to a second embodiment of the present invention.

As shown in FIG. 3, the operational amplifier comprises a constant-current regulated power supply Il, input-stage paired transistors M22, M23, M24, M25, and load transistors M26, M27, M28, M29. The transistors M22, M25, which are N channel MOS transistors, have gates connected to a noninverting input terminal IN+, and the transistors M23, M24, which are N channel MOS transistors, have gates connected to an inverting input terminal IN−. The operational amplifier includes a drive stage comprising P channel MOS transistors M30, M31, M36, M37 and N channel MOS transistors M32, M33, M34, M35. The operational amplifier also has an N channel MOS transistor M21 that operates as a constant-current regulated power supply. P channel MOS transistors M38, M39 and capacitive elements C1, C2 jointly constitute a phase-compensating circuit.

Operation of the operational amplifier according to the second embodiment will be described below with reference to FIG. 3.

When the potential at the noninverting input terminal IN+ is higher than the potential at the inverting input terminal IN−, currents flowing through the N channel MOS transistors M22, M25 are greater than currents flowing through the N channel MOS transistors M23, M24, respectively. Therefore, the potential at the common gate of the P channel MOS transistors M27, M29 is lowered. Since the current flowing through the P channel MOS transistor M29 (which is the same as the current flowing through the N channel MOS transistor M25) is increased, the drain potential thereof is decreased. Therefore, the drain of the P channel MOS transistor M29 is used as an output voltage point X of the initial stage and connected to an input terminal of the drive stage so that the potential at the output terminal of the drive stage is increased. At this time, the current flowing through the P channel MOS transistor M31 is increased, and the current flowing through the P channel MOS transistor M37 is increased by a current mirror circuit composed of the N channel MOS transistors M33, M35, resulting in a further increase in the voltage at the noninverted output terminal OUT+. The potential at an initial-stage output voltage point Y is also increased, causing the potential at an inverted output terminal OUT− to decrease.

Conversely, when the potential at the noninverting input terminal IN+ is lower than the potential at the inverting input terminal IN−, the currents flowing through the N channel MOS transistors M22, M25 are less than currents flowing through the N channel MOS transistors M23, M24, respectively. Therefore, the potential at the common gate of the P channel MOS transistors M27, M29 is increased. Since the current flowing through the P channel MOS transistor M29 (which is the same as the current flowing through the N channel MOS transistor M25) decreases, the drain potential thereof is increased. Therefore, the drain of the P channel MOS transistor M29 is used as an output voltage point X of the initial stage and connected to the input terminal of the drive stage so that the potential at the output terminal of the drive stage is decreased. At this time, the current flowing through the P channel MOS transistor M31 is decreased, and the current flowing through the P channel MOS transistor M37 is reduced by the current mirror circuit composed of the N channel MOS transistors M33, M35, resulting in a further decrease in the voltage at the noninverted output terminal OUT+. The potential at the initial-stage output voltage point Y is also decreased, increasing the potential of the inverted output terminal OUT−.

With the present invention, as described above, it is possible to equalize the rise and fall times of the output signal from the output terminal of the differential operational amplifier and also increase the common mode gain of the differential operational amplifier. In cases where the operational amplifier is designed for an increased GB product, it is possible for the operational amplifier to have a large Dc gain of about 80 dB.

Although certain preferred embodiments of the present invention have been shown and described in detail, it should be understood that various changes and modifications may be made therein without departing from the scope of the appended claims.

I claim:

1. An operational amplifier comprising:
   at least initial and drive stages;
   said initial stage comprising a first power supply terminal; a first constant-current regulated power supply having one terminal connected to said first power supply terminal; a first field-effect transistor of a first conductivity type having a source connected to said first power supply terminal; second and third field-effect transistors of the first conductivity type having respective sources connected to a drain of said first field-effect transistor of the first conductivity type; fourth and fifth field-effect transistors of the first conductivity type having respective sources connected to an opposite terminal of said first constant-current regulated power supply; a second power supply terminal; a first field-effect transistor of a second conductivity type having a drain and a gate connected to a drain of said second field-effect transistor of the first conductivity type and a source connected to said second power supply terminal; a second field-effect transistor of the second conductivity type having a drain and a gate connected to a drain of said third field-effect transistor of the first conductivity type and a source connected to said second power supply terminal; a third field-effect transistor of the second conductivity type having a drain connected to a drain of said fourth field-effect transistor of the first conductivity type, a gate connected in common to a drain and a gate of said first field-effect transistor of the second conductivity type, and a source connected to said second power supply terminal; a fourth field-effect transistor of the second conductivity type having a drain connected to a drain of said fifth field-effect transistor of the first conductivity type, a gate connected in common to a drain and a gate of said second field-effect transistor of the second conductivity type, and a source connected to said second power supply terminal, a noninverting input terminal connected to gates of said second and fifth field-effect transistors of the first conductivity type; and an inverting input terminal connected to gates of said third and fourth field-effect transistors of the first conductivity type;

said drive stage comprising a fifth field-effect transistor of the second conductivity type having a gate connected to the gate of said third field-effect transistor of the second conductivity type and a source connected to said second power supply terminal; a sixth field-effect transistor of the second conductivity type having a gate connected to the gate of said fourth field-effect transistor of the second conductivity type and a source connected to said second power supply terminal; a sixth field-effect transistor of the first conductivity type having a drain and a gate commonly connected to a drain of said fifth field-effect transistor of the second conductivity type and a source connected to said first power supply terminal; a seventh field-effect transistor of the first conductivity type having a drain and a gate commonly connected to a drain of said sixth field-effect transistor of the second conductivity type and a source connected to said first power supply terminal; a seventh field-effect transistor of the second conductivity type having a gate connected in common to the drain of said fourth field-effect transistor of the first conductivity type and a drain of the third field-effect transistor of the second conductivity type and a source connected to said second power supply terminal; an eighth field-effect transistor of the first conductivity type having a gate connected in common to the drain of said fifth field-effect transistor of the first conductivity type and a drain of the fourth field-effect transistor of the second conductivity type and a source connected to said second power supply terminal; an eighth field-effect transistor of the second conductivity type having a drain connected to a drain of the seventh field-effect transistor of the second conductivity type, a gate connected in common to the drain and the gate of said sixth field-effect transistor of the first conductivity type, and a source connected to said first power supply terminal; a ninth field-effect transistor of the second conductivity type having a drain connected to the drain of the eighth field-effect transistor of the second conductivity type, a gate connected in common to the drain and the gate of said seventh field-effect transistor of the first conductivity type, and a source connected to said first power supply terminal; an inverted output terminal connected in common to the drain of the seventh field-effect transistor of the second conductivity type and the drain of said eighth field-effect transistor of the second conductivity type; and a noninverted output terminal connected in common to the drain of the ninth field-effect transistor of the second conductivity type and the drain of said eighth field-effect transistor of the second conductivity type;

a circuit for producing the average of a voltage at said noninverted output terminal and a voltage at said inverted output terminal; and a feedback loop interconnecting an output terminal of said circuit and a gate of said first field-effect transistor of the first conductivity type.

2. An operational amplifier according to claim 1, wherein each of the field-effect transistors of the first conductivity type comprises a P channel MOS transistor, and each of the field-effect transistors of the second conductivity type comprises an N channel MOS transistor.

3. An operational amplifier according to claim 1, wherein each of the field-effect transistors of the first conductivity type comprises an N channel MOS transistor, and each of the field-effect transistors of the second conductivity type comprises a P channel MOS transistor.

* * * * *